(12) United States Patent
Le et al.

(10) Patent No.: US 8,169,779 B2
(45) Date of Patent: May 1, 2012

(54) POWER ELECTRONICS SUBSTRATE FOR DIRECT SUBSTRATE COOLING

(75) Inventors: Khiet Le, Mission Viejo, CA (US); Terence G. Ward, Redondo Beach, CA (US); Brooks S. Mann, Redondo Beach, CA (US); Edward P. Yankoski, Corona, CA (US); Gregory S. Smith, Woodland Hills, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 5 days.

(21) Appl. No.: 12/638,683

(22) Filed: Dec. 15, 2009

(65) Prior Publication Data

US 2011/0141690 A1 Jun. 16, 2011

(51) Int. Cl.
*H05K 7/20* (2006.01)

(52) U.S. Cl. ........ 361/689; 361/699; 361/704; 361/719; 361/720; 165/104.33; 165/185; 165/908; 363/141

(58) Field of Classification Search ............ 361/679.47, 361/679.49–679.5, 679.54, 690, 692, 702, 361/704, 707, 719, 699, 720; 165/185, 908, 165/104.33; 363/141
See application file for complete search history.

(56) References Cited

U.S. PATENT DOCUMENTS

| | | | |
|---|---|---|---|
| 5,016,090 A | 5/1991 | Galyon et al. | |
| 5,353,865 A * | 10/1994 | Adiutori et al. | 165/133 |
| 5,477,008 A | 12/1995 | Pasqualoni et al. | |
| 5,703,761 A | 12/1997 | Heiss | |
| 5,794,684 A * | 8/1998 | Jacoby | 165/80.3 |
| 5,959,351 A | 9/1999 | Sasaki et al. | |
| 5,966,291 A | 10/1999 | Baumel et al. | |
| 6,015,008 A * | 1/2000 | Kogure et al. | 165/185 |
| 6,269,864 B1 * | 8/2001 | Kabadi | 165/80.3 |
| 6,350,949 B1 | 2/2002 | Boyd | |
| 6,519,151 B2 * | 2/2003 | Chu et al. | 361/699 |
| 6,721,181 B1 * | 4/2004 | Pfeifer et al. | 361/704 |
| 6,736,192 B2 * | 5/2004 | Chang | 165/80.3 |
| 6,892,796 B1 | 5/2005 | Nagashima et al. | |
| 7,019,395 B2 | 3/2006 | Hirano et al. | |
| 7,046,535 B2 | 5/2006 | Rodriguez et al. | |
| 7,096,678 B2 * | 8/2006 | Petroski | 62/3.2 |
| 7,295,433 B2 | 11/2007 | Taylor et al. | |
| 7,333,337 B2 * | 2/2008 | Kita | 361/710 |
| 7,355,856 B2 * | 4/2008 | Petroski | 361/710 |

(Continued)

FOREIGN PATENT DOCUMENTS

DE 10 2004 014 911 A1 10/2004

(Continued)

OTHER PUBLICATIONS

Beitelmal et al., "Effects of Surface Roughness on the Average Heat Transferof an Impinging Air Jet", Int. Comm. Heat Mass Transfer, vol. 27, No. 1, pp. 1-12, 2000.*

(Continued)

*Primary Examiner* — Robert J Hoffberg
(74) *Attorney, Agent, or Firm* — Ingrassia Fisher & Lorenz, P.C.

(57) ABSTRACT

Systems and apparatus are provided for power electronics substrates adapted for direct substrate cooling. A power electronics substrate comprises a first surface configured to have electrical circuitry disposed thereon, a second surface, and a plurality of physical features on the second surface. The physical features are configured to promote a turbulent boundary layer in a coolant impinged upon the second surface.

14 Claims, 2 Drawing Sheets

U.S. PATENT DOCUMENTS

| | | | |
|---|---|---|---|
| 7,508,682 B2 | 3/2009 | Badarinarayan et al. | |
| 7,580,261 B2 * | 8/2009 | Smith et al. | 361/699 |
| 7,659,559 B2 | 2/2010 | Lee | |
| 7,760,506 B1 * | 7/2010 | Wang et al. | 361/709 |
| 7,763,811 B2 | 7/2010 | Wetzel | |
| 7,800,220 B2 | 9/2010 | Marz et al. | |
| 7,880,283 B2 | 2/2011 | Zhuang | |
| 7,884,468 B2 * | 2/2011 | Mann et al. | 257/714 |
| 7,940,532 B2 | 5/2011 | Willing et al. | |
| 8,059,418 B2 | 11/2011 | Blake, III | |
| 2003/0053298 A1 | 3/2003 | Yamanda et al. | |
| 2003/0161110 A1 | 8/2003 | Spasevski et al. | |
| 2004/0160731 A1 | 8/2004 | Yamaguchi | |
| 2005/0011212 A1 * | 1/2005 | Bistekos | 62/259.2 |
| 2007/0097627 A1 | 5/2007 | Taylor et al. | |
| 2007/0240868 A1 * | 10/2007 | Wu et al. | 165/185 |
| 2009/0032937 A1 * | 2/2009 | Mann et al. | 257/712 |
| 2009/0090490 A1 * | 4/2009 | Yoshida et al. | 165/104.33 |
| 2010/0053889 A1 * | 3/2010 | Miller et al. | 361/689 |
| 2010/0091457 A1 * | 4/2010 | Krause | 361/689 |

FOREIGN PATENT DOCUMENTS

| | | |
|---|---|---|
| DE | 10 2006 006 175 A1 | 8/2007 |
| EP | 0 841 843 B1 | 5/2001 |
| EP | 1 742 264 A2 | 1/2007 |
| JP | 2007-084040 A | 4/2007 |
| WO | 2008/089711 A1 | 7/2008 |

OTHER PUBLICATIONS

Miller, D.H., et al., "Inverter Power Module for With Distributed Support for Direct Substrate Cooling," U.S. Appl. No. 12/198,723, filed Aug. 26, 2008.

U.S. Office Action for U.S. Appl. No. 12/178,489 mailed Jun. 3, 2010.

Office Action, dated Jul. 15, 2011, for U.S. Appl. No. 12/198,723.

U.S. Final Office Action, dated Dec. 14, 2011, for U.S. Appl. No. 12/198,723.

* cited by examiner

POWER ELECTRONICS SUBSTRATE FOR DIRECT SUBSTRATE COOLING

STATEMENT REGARDING FEDERALLY SPONSORED RESEARCH OR DEVELOPMENT

This invention was made with Government support under DE-FC26-07NT43123, awarded by the United States Department of Energy. The Government has certain rights in this invention.

TECHNICAL FIELD

Embodiments of the subject matter described herein relate generally to power electronics modules, and more particularly, embodiments of the subject matter relate to inverter power modules having substrates adapted for use with direct substrate cooling methods.

BACKGROUND

Many electrical components generate heat as a byproduct when they dissipate electrical energy. Overheating often affects the performance and reliability of electronic components, and thus, electrical devices are routinely cooled to prevent overheating.

In many power electronics applications, heat sinks are used where efficient heat dissipation is desired. Heat sinks absorb and dissipate heat from electrical components by thermal contact. For example, a heat sink may be soldered or mounted to a power electronic substrate to cool the substrate. In higher power applications, the heat sink is often increased in size in order to improve its thermal capacity. Increasing the size of the heat sink results in increased cost, weight, and volume of the respective power electronics module. The increased weight and volume of the power electronics module is undesirable from a packaging perspective. For example, in automotive applications, packaging space under the hood is limited and increasing the weight of the vehicle is undesirable.

Alternative cooling methods may be employed to cool the power electronics substrate. However, as compared to heat sinks, these alternative cooling methods become less effective as the surface area of the power electronics substrate increases.

BRIEF SUMMARY

In accordance with one embodiment, an apparatus is provided for an electronics substrate. The electronics substrate comprises a first surface configured to have electrical circuitry disposed thereon, a second surface, and a plurality of physical features on the second surface. The physical features are configured to promote a turbulent boundary layer in a coolant impinged upon the second surface.

In accordance with another embodiment, a power inverter module suitable for use in a vehicle is provided. The power inverter module comprises a power electronics substrate having a first surface and a second surface. The second surface is electrically isolated from the first surface and includes a plurality of turbulence-inducing features configured to promote turbulence in a fluid in contact with the second surface. The power inverter module further comprises inverter circuitry disposed on the first surface.

In another embodiment, an electronics module is provided. The electronics module comprises a power electronics substrate having a first surface and a second surface, circuitry disposed on the first surface, and a support frame adapted to house the power electronics substrate. The support frame includes one or more openings adapted to allow coolant to impinge upon the second surface of the power electronics substrate. The second surface includes a plurality of physical features that inhibit a laminar boundary layer between the coolant and the second surface of the power electronics substrate.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
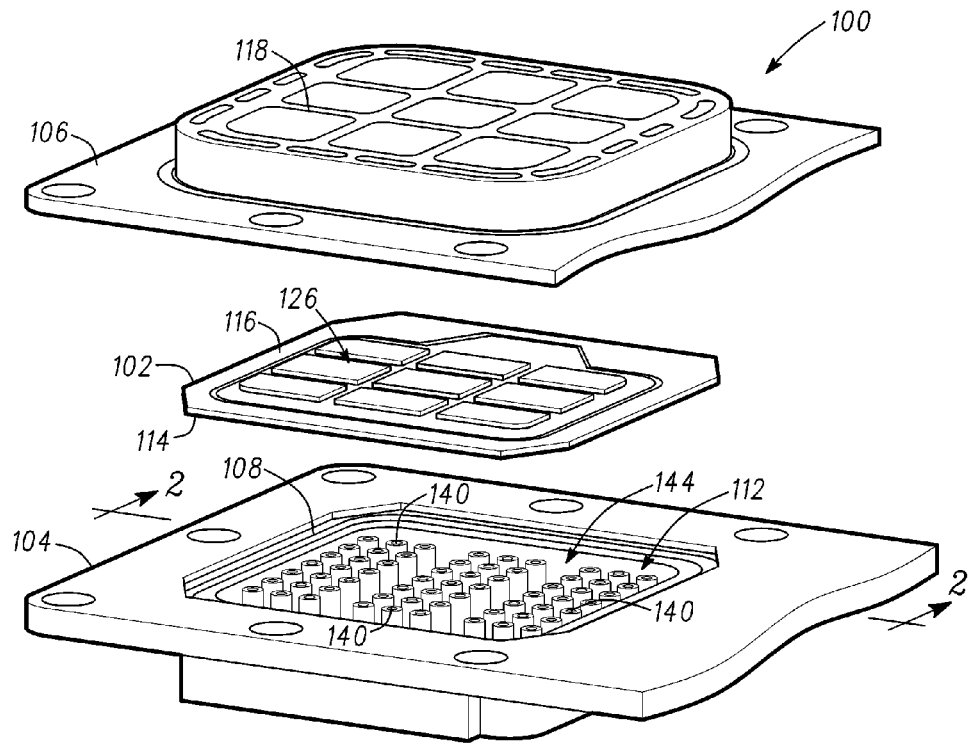
FIG. 1 is an exploded view of a power inverter module suitable for use in a vehicle in accordance with one embodiment.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Although the following figures may depict one exemplary arrangement of elements, additional intervening elements, devices, features, or components may be present in an embodiment of the depicted subject matter. In addition, certain terminology may also be used in the following description for the purpose of reference only, and thus are not intended to be limiting. For example, terms such as "upper", "lower", "top", and "bottom" refer to directions in the drawings to which reference is made. Such terminology may include the words specifically mentioned above, derivatives thereof, and words of similar import. Similarly, the terms "first", "second" and other such numerical terms referring to structures do not imply a sequence or order unless clearly indicated by the context.

Technologies and concepts described herein relate generally to power electronics substrates adapted for direct substrate cooling. A surface of the power electronics substrate exposed to liquid coolant includes physical features configured to inhibit formation of a laminar boundary layer along the surface of the power electronics substrate and increase the effective surface area of the power electronics substrate exposed to the coolant. The turbulent thermal boundary and increased surface area improve the efficiency of heat transfer from the power electronics substrate to the coolant, and thus, more effectively reduces the temperature of components on the opposing surface of the power electronics substrate.

Figure 2:
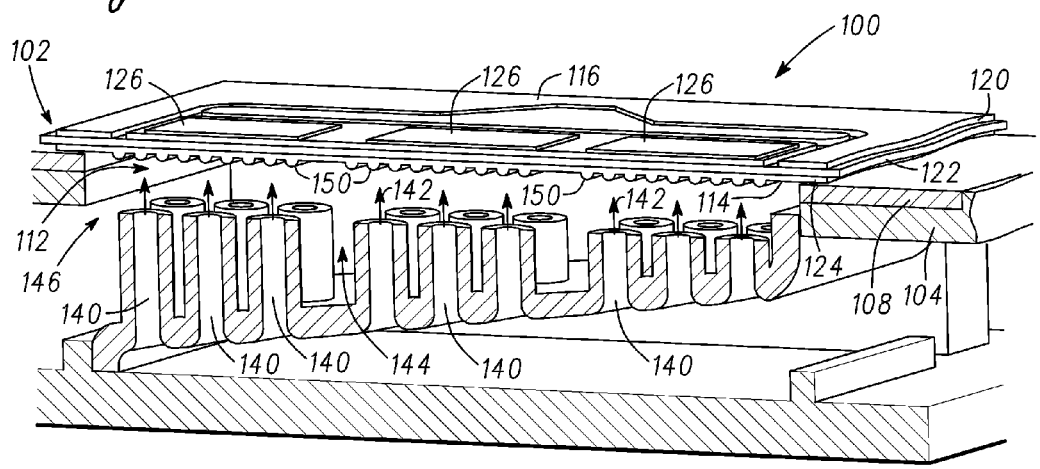
FIG. 2 is a cross-sectional view of the lower support frame and power electronics substrate of the power inverter module of FIG. 1 along the line 2-2 in accordance with one embodiment.

Referring now to FIGS. 1-2, in an exemplary embodiment, a power module 100 includes, without limitation, a power electronics substrate 102, a lower support frame 104, and an upper support frame 106. It should be understood that FIG. 1 depict a simplified representation of power module 100 for clarity and ease of explanation, and is not intended to limit the scope of the subject matter in any way.

In an exemplary embodiment, the power module 100 is formed by joining the support frames 104, 106 to support and/or encapsulate the power electronics substrate 102. In this regard, the support frames 104, 106 are configured to house and/or substantially enclose the power electronics substrate 102 and restrict displacement of the power electronics substrate 102 relative to the support frames 104, 106 when the support frames 104, 106 are joined. In an exemplary embodiment, the support frames 104, 106 are realized as injection molded plastic frames, however, in alternative embodiments, the support frames 104, 106 may be realized as metal (e.g., aluminum or another suitable metal) or another suitable material having sufficient rigidity. The power electronics substrate 102 is disposed between the support frames 104, 106, and the sealing element 108 is disposed between the power electronics substrate 102 and the lower support frame 104.

In an exemplary embodiment, the lower support frame 104 defines an exposure region 112 which is adapted to allow coolant or direct substrate cooling methods to interface with portions of the lower surface 114 of the power electronics substrate 102 which are substantially aligned with the exposure region 112. In an exemplary embodiment, the sealing element 108 encompasses the perimeter of the exposure region 112, such that when the support frames 104, 106 are compressed and joined to form the power module 100, the sealing element 108 provides a compressive seal between the lower support frame 104 and the power electronics substrate 102 about the exposure region 112. In an exemplary embodiment, the lower support frame 104 includes one or more openings 140 within the exposure region 112 adapted for direct substrate cooling (e.g., jet impingement cooling), as described in greater detail below. In accordance with one embodiment, when the support frames 104, 106 are joined, the upper surface of the openings 140 and the lower surface 114 of the power electronics substrate 102 are separated by about 2 to 3 millimeters (mm). The lower support frame 104 is recessed relative to the power electronics substrate 102 within the exposure region 112 to provide a reservoir 144 (or chamber) for coolant provided to the lower surface 114 of the power electronics substrate 102 via openings 140. In this regard, the reservoir 144 comprises a void or space between the power electronics substrate 102 and the lower support frame 104 that is substantially aligned with or otherwise corresponds to the exposure region 112. As best shown in FIG. 2, in an exemplary embodiment, the lower support frame 104 is configured such that a lower surface of the reservoir 144 is sloped or graded such that the volume of the reservoir 144 between the power electronics substrate 102 and the lower support frame 104 increases towards a cutout region 146, which provides a conduit for coolant to exit the reservoir 144 and directs or otherwise controls the flow of coolant laterally (e.g., substantially parallel to the lower surface 114 of the power electronics substrate 102).

In an exemplary embodiment, a cooling mechanism is integral with and/or joined to the lower support frame 104 and configured such that the cooling mechanism provides coolant to the power electronics substrate 102 through openings 140 in the direction indicated by arrows 142. For example, the cooling mechanism may be joined to support lower support frame 104 and adapted to provide jet impingement cooling to the exposed surface 114 of the power electronics substrate 102 that is proximate the support frame 104 and aligned with the exposure region 112 via openings 140. Jet impingement cooling should be understood as referring to the process of using jets to provide and/or direct a flow of liquid coolant fluid through the openings 140 such that the liquid coolant fluid is impinged upon the lower surface 114 of the power electronics substrate 102. In an exemplary embodiment, coolant is injected into the reservoir 144 substantially perpendicular to (or orthogonal to) the lower surface 114 of the power electronics substrate 102 (i.e., in the direction indicated by arrows 142) through the openings 140. As described in greater detail below, the coolant collides with or is otherwise impinged upon the power electronics substrate 102 and becomes deflected radially outward along the lower surface 114 of the power electronics substrate 102. The cross supports 118 of the upper support frame 106 oppose the exposure regions 112 and provide distributed support and structural rigidity across the power electronics substrate 102 to reduce or prevent deflection (e.g., toward upper support frame 106) of the power electronics substrate 102 as a result of the force caused by the flow of coolant and the difference in ambient pressure across the opposing surfaces of the power electronics substrate 102. In an exemplary embodiment, the lower surface 114 of the power electronics substrate 102 is electrically cold, such that cooling mechanism may utilize radiator coolant or another suitable coolant, as will be appreciated in the art. In alternative embodiments, the cooling mechanism may utilize and/or provide a dielectric coolant if cooling an electrically hot surface of the power electronics substrate 102.

In an exemplary embodiment, the upper surface 116 of the power electronics substrate 102 comprises an electrically hot surface that includes electrical traces and circuitry 126 for a power inverter suitable for use with an electric motor in an electric and/or hybrid vehicle. The inverter circuitry 126 comprises one or more semiconductor devices and/or other suitable elements configured to accommodate power conversion from direct current to alternating current, as will be appreciated in the art. In an exemplary embodiment, the inverter circuitry 126 includes a plurality of transistors (e.g., insulated-gate bipolar transistors or IGBTs), with each transistor having a diode configured antiparallel to the respective transistor.

In accordance with one or more embodiments, the power electronics substrate 102 comprises an upper layer 120, an intermediate layer 122, and a lower layer 124. The upper layer 120 is realized as an electrically conductive layer comprising a conductive material, such as copper, aluminum, or another suitable material. In an exemplary embodiment, the thickness of the upper layer 120 is between about 0.3 to 0.4 mm, however, in practical embodiments, the thickness of the upper layer 120 may vary depending on the needs of a particular application. Depending on the embodiment, the inverter circuitry 126 may be formed on, soldered to, mounted to, affixed to, or otherwise disposed on the upper layer 120 of the power electronics substrate 102. In an exemplary embodiment, the lower layer 124 is realized as a thermally conductive layer that is electrically isolated from the upper layer 120 by virtue of the intermediate layer 122. In this regard, the intermediate layer 122 is realized as a nonconductive material that provides sufficient electrical isolation between the upper and lower layers 120, 124. In an exemplary embodiment, the intermediate layer 122 comprises a ceramic material, such as aluminum oxide, aluminum nitride, silicon nitride, or the like. In an exemplary embodiment, the thickness of the intermediate layer 122 is between about 0.3 to 0.6 mm, however, in practical embodiments, the thickness of the intermediate layer 122 may vary depending on the needs of a particular application. The lower layer 124 may be realized as a conductive material, such as copper, aluminum, or another suitable material.

In accordance with one or more embodiments, the power electronics substrate 102 is realized as a direct bonded copper (DBC) substrate. In such an embodiment, the upper layer 120 is realized as an etched copper layer having electrical traces and/or connectivity (e.g., electrically hot) and including inverter circuitry 126, the intermediate layer 122 comprises a ceramic material, and the lower layer 124 is realized as another copper layer which may or may not be etched or electrically connected (e.g., electrically cold). At least a portion of the lower surface 114 of the lower layer 124 is exposed to coolant via exposure region 112. In this regard, in accordance with one or more embodiments, when the lower layer 124 comprises copper, the lower surface 114 of the lower layer 124 may plated with nickel to prevent galvanic mismatch between the lower layer 124 and the coolant in the reservoir 144. It should be appreciated that the subject matter described herein is not limited to DBC substrates, and in alternative embodiments, other suitable substrate materials may be used, such as, for example, direct bond aluminum (DBA), insulated metal substrate (IMS) or bare copper, as will be appreciated in the art.

As best shown in FIG. 2, in an exemplary embodiment, the lower surface 114 of the power electronics substrate 102 and/or lower layer 124 includes one or more turbulence-inducing features 150. As used herein, a turbulence-inducing feature should be understood as a physical feature that promotes a turbulent thermal boundary layer along the surface having the turbulence-inducing feature, that is, the turbulence-inducing feature inhibits a laminar thermal boundary layer along the surface. A thermal boundary layer should be understood as referring to the region of fluid within a particular distance of the surface, wherein the temperature of the fluid at that particular distance from the fluid is substantially equal to (e.g., within 1% or 5% of) the ambient temperature of the fluid away from the surface. The turbulence-inducing features 150 also increase the effective surface area of the lower surface 114 of the power electronics substrate 102 and/or lower layer 124 exposed to coolant.

As described above, in an exemplary embodiment, the cooling mechanism provides coolant from the openings 140 in a direction substantially perpendicular to the lower surface 114 of the power electronics substrate 102, as indicated by arrows 142. In an exemplary embodiment, the coolant collides with or is otherwise impinged upon the lower surface 114 of the power electronics substrate 102 and is deflected or otherwise directed radially outward and substantially parallel to the lower surface 114 of the power electronics substrate 102 (e.g., orthogonal to arrows 142 along the lower surface 114). In this regard, in the absence of turbulence-inducing features 150, the coolant flows radially outward and substantially laminar with respect to the lower surface 114 of the power electronics substrate 102, resulting in a substantially laminar thermal boundary layer. As described above, the turbulence-inducing features 150 promote a turbulent flow of liquid coolant along the lower surface 114 of the power electronics substrate 102 and/or lower layer 124 and inhibit laminar flow of liquid coolant parallel the lower surface 114 of the power electronics substrate 102 and/or lower layer 124. Thus, by virtue of the turbulence-inducing features 150, the thermal boundary layer in the liquid coolant along the lower surface of the power electronics substrate 102 and/or lower layer 124 becomes more turbulent. A turbulent thermal boundary along the lower surface of the power electronics substrate 102 results in an improved rate and/or amount of heat transfer from the power electronics substrate 102 to the coolant.

As described in greater detail below, depending on the embodiment, the turbulence-inducing features 150 may be realized as protrusions from the lower surface 114 of the power electronics substrate 102 and/or lower layer 124, recesses into the lower surface 114 of the power electronics substrate 102 and/or lower layer 124, or a combination thereof (e.g., a combination of protrusions and recesses on the lower surface 114). In accordance with one or more embodiments, the turbulence-inducing features 150 are uniformly distributed throughout the portion of the lower surface of the power electronics substrate 102 that is aligned with the exposure region(s) 112. In such embodiments, each turbulence-inducing feature 150 is separated from other turbulence-inducing features 150 by substantially the same separation distance. In alternative embodiments, the turbulence-inducing features 150 may have a nonuniform distribution about the lower surface of the power electronics substrate 102, depending on the needs of a particular application. For example, the turbulence-inducing features 150 may be concentrated in particular areas or regions of the lower surface of the power electronics substrate 102 that are particularly likely to have (or are susceptible to having) a laminar flow and/or laminar thermal boundary layer. Alternatively, the turbulence-inducing features 150 may be concentrated in areas or regions of the power electronics substrate 102 that have greater heat transfer requirements, for example, areas and/or regions of the power electronics substrate 102 underlying electrical components of the inverter circuitry 126 with higher power handling and/or thermal requirements (e.g., IGBTs). In this regard, the turbulence-inducing features 150 may be disposed on the power electronics substrate 102 substantially opposite the inverter circuitry 126. In an exemplary embodiment, the separation distance, that is, the distance between turbulence-inducing features 150, is greater than or equal to the thickness of a laminar thermal boundary layer that would form on the lower surface 114 absent turbulence-inducing features 150.

Figure 3:
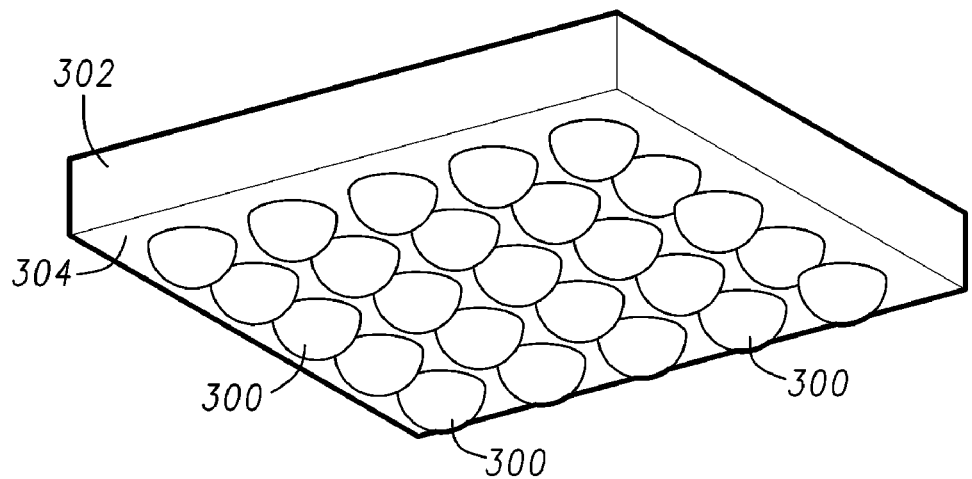
FIG. 3 is a perspective view of a power electronics substrate suitable for use in the power inverter module of FIG. 1 having features protruding from a surface of the power electronics substrate in accordance with one embodiment.

Referring now to FIG. 3, in accordance with one embodiment, the turbulence-inducing features 300 protrude from a surface 304 (e.g., lower surface 114) of a power electronics substrate 302 (e.g., power electronics substrate 102). As shown in FIG. 3, the turbulence-inducing features 300 have substantially circular cross-sections and are symmetrical. However, it should be noted that in other embodiments, the turbulence-inducing features 300 may have differently shaped cross-sections and/or may be asymmetrical with respect to one another, and FIG. 3 is not intended to limit the scope of the subject matter in any way. In accordance with one or more embodiments, the turbulence-inducing features 300 are smoothed and/or arcuate and interface with the surface 304 of the power electronics substrate 302 in a manner that allows substantially continuous flow along the surface 304 of the power electronics substrate 302 (i.e., parallel to the surface 304).

In an exemplary embodiment, the distance (or amount) by which the turbulence-inducing features 300 protrude perpendicularly from the surface 304 is less than or equal to twice the thickness of the laminar thermal boundary layer that would result along the surface 304 of the power electronics substrate 302 in the absence of the turbulence-inducing features 300. For example, in accordance with one embodiment, the laminar thermal boundary layer in the absence of the turbulence-inducing features 300 is approximately 0.1 mm thick, wherein the turbulence-inducing features 300 protrude from the surface 304 of the power electronics substrate 302 by about 0.15 mm, producing a 20% increase in the effective surface area of the lower surface of the power electronics substrate 302 and a 18% reduction in the temperature of the opposing surface (e.g., the upper surface 116) of the power electronics substrate 302 as compared to a power electronics substrate 302 lacking turbulence-inducing features 300.

In accordance with one embodiment, the turbulence-inducing features 300 are formed from the same material as the surface 304 of the power electronics substrate 302. For example, in accordance with one embodiment, portions of the power electronics substrate 302 surrounding the areas where turbulence-inducing features 300 are to be formed may be selectively removed (e.g., by etching, machining, stamping, or the like) resulting in turbulence-inducing features 300 protruding from the surface 304 of the power electronics substrate 302. In alternative embodiments, the turbulence-inducing features 300 may be mounted, soldered, fastened, or otherwise affixed to the surface 304 of the power electronics substrate 302. In this regard, the turbulence-inducing features 300 may comprise a thermally conductive material different from the lower surface of the power electronics substrate 302 (e.g., lower layer 124), such as, for example, carbon nanotubes.

Figure 4:
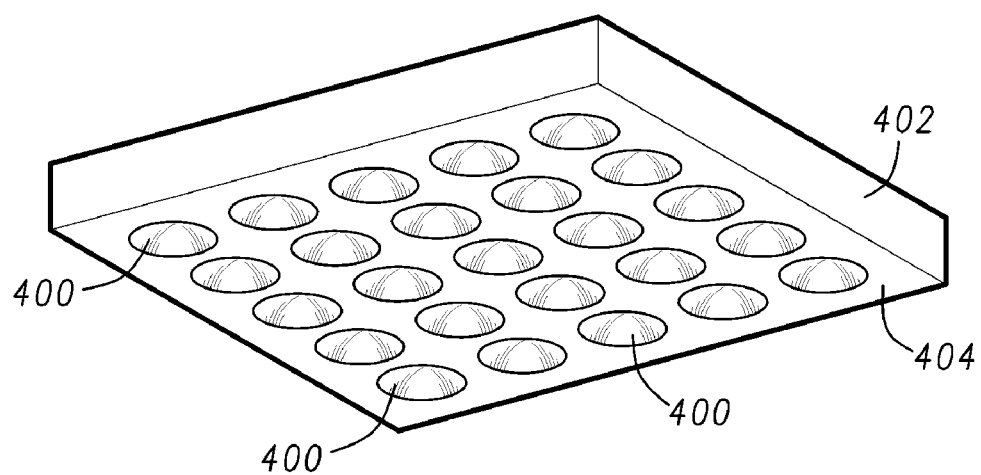
FIG. 4 is a perspective view of a power electronics substrate suitable for use in the power inverter module of FIG. 1 having features recessed from a surface of the power electronics substrate in accordance with one embodiment.

Referring now to FIG. 4, in accordance with another embodiment, the turbulence-inducing features 400 comprises recesses or voids into the surface 404 (e.g., lower surface 114) of a power electronics substrate 402 (e.g., power electronics substrate 102). As shown in FIG. 4, the turbulence-inducing features 400 are symmetrical and have substantially circular cross-sections. However, it should be noted that in other embodiments, the turbulence-inducing features 400 may have differently shaped cross-sections and/or may be asymmetrical with one another, and FIG. 4 is not intended to limit the scope of the subject matter in any way. In an exemplary embodiment, the depth (or amount) by which the turbulence-inducing features 400 recede perpendicularly from the surface 404 is less than or equal to twice the thickness of the laminar thermal boundary layer that would result along the surface 404 of the power electronics substrate 402 in the absence of the turbulence-inducing features 400. For example, in accordance with one embodiment, the thermal boundary layer in the absence of the turbulence-inducing features 400 is approximately 0.1 mm thick, wherein the turbulence-inducing features 400 are recessed from the surface 404 of the power electronics substrate 402 by about 0.15 mm, producing a 20% increase in the effective surface area of the lower surface of the power electronics substrate 402 and a 13% reduction in the temperature of the opposing surface (e.g., the upper surface) of the power electronics substrate 402 as compared to a power electronics substrate 402 lacking turbulence-inducing features 400. Portions of the power electronics substrate 402 may be selectively removed (e.g., by etching, extruding, machining, stamping, or the like) to provide recessed features 400 in the surface 404 of the power electronics substrate 402 in a similar manner as described above. For example, portions of the surface 404 of the power electronics substrate 402 in areas where the turbulence-inducing features 400 are to be formed may be etched to remove portions of the power electronics substrate 402, resulting in recessed regions 400 relative to the surface 404.

One advantage of the system and/or method described above is that the power electronics substrate may be cooled without the use of a heat sink. Turbulence-inducing features provided on the surface of the power electronics substrate exposed to coolant create turbulent thermal boundary layer at the surface of the power electronics substrate and increasing the effective surface area of the power electronics substrate that is exposed to coolant, thereby improving the effectiveness of direct substrate cooling methods. Depending on the needs of a particular application as well as the available materials and manufacturing techniques, the turbulence-inducing features may protrude from a surface of the power electronics substrate or be recessed in the surface of the power electronics substrate, or a combination thereof. Furthermore, the size, shape and/or arrangement of the turbulence-inducing features may be modified to achieve desired performance characteristics for a particular application.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A power inverter module suitable for use in a vehicle comprising:
    a power electronics substrate having a first surface and a second surface, the second surface being electrically isolated from the first surface, wherein the second surface is opposite the first surface and includes a plurality of turbulence-inducing features configured to promote turbulence in a fluid in contact with the second surface;
    inverter circuitry disposed on the first surface;
    a first support frame;
    a second support frame defining an exposure region adapted to allow coolant to interface with the second surface of the power electronics substrate; and
    a sealing element disposed between the second support frame and the power electronics substrate, the sealing element encompassing the exposure region, wherein:
        the first support frame and the second support frame are joined to encapsulate the power electronics substrate;
        the sealing element provides a compressive seal about the exposure region when the first support frame and the second support frame are joined; and
        the plurality of turbulence-inducing features promote a turbulent boundary layer between the coolant and the power electronics substrate.

2. The power inverter module of claim 1, wherein the power electronics substrate comprises:
    a first layer, the first layer being electrically conductive and having the inverter circuitry disposed thereon;
    a second layer, the second layer being thermally conductive and having the plurality of turbulence-inducing features disposed thereon; and an intermediate layer interposed between the first layer and the second layer, the intermediate layer providing electrical isolation between the first layer and the second layer.

3. The power inverter module of claim 1, wherein the plurality of turbulence-inducing features are substantially opposite the inverter circuitry.

4. The power inverter module of claim 1, wherein:
the second surface of the power electronics substrate comprises a first thermally conductive material; and
the turbulence-inducing features are formed from the first thermally conductive material.

5. The power inverter module of claim 1, wherein the fluid is impinged upon the second surface perpendicular to the second surface.

6. The power inverter module of claim 1, wherein the first support frame comprises a first injection molded plastic frame and the second support frame comprises a second injection molded plastic frame.

7. The power inverter module of claim 1, wherein the first support frame includes a cross support opposite the exposure region.

8. The power inverter module of claim 1, wherein the power electronics substrate comprises a direct bonded copper substrate having an upper copper layer including the inverter circuitry, an intermediate layer comprising a ceramic material, and a lower copper layer including the plurality of turbulence-inducing features.

9. The power inverter module of claim 8, wherein the lower copper layer is plated with nickel to prevent galvanic mismatch between the lower copper layer and the coolant.

10. An electronics module comprising:
a power electronics substrate having a first surface and a second surface opposite the first surface, wherein the second surface includes a plurality of physical features;
circuitry disposed on the first surface;
a lower support frame adapted to house the power electronics substrate, the lower support frame including one or more openings adapted to allow coolant to impinge upon the second surface of the power electronics substrate, wherein the plurality of physical features inhibit a laminar boundary layer between the coolant and the second surface of the power electronics substrate; and
an upper support frame adapted to house the power electronics substrate, wherein the upper support frame and the lower support frame are joined to encapsulate the power electronics substrate and provide a compressive seal about the one or more openings.

11. The electronics module of claim 10, wherein the plurality of physical features are symmetrical and uniformly distributed about the second surface of the power electronics substrate.

12. The electronics module of claim 10, wherein the upper support frame includes cross supports to provide distributed support across the power electronics substrate.

13. The electronics module of claim 10, wherein the upper and lower support frames each comprise an injection molded plastic frame.

14. The electronics module of claim 10, further comprising a sealing element disposed between the lower support frame and the power electronics substrate, wherein the sealing element provides the compressive seal when the upper support frame and the lower support frame are joined.

* * * * *